(12) United States Patent
Singh

(10) Patent No.: US 9,780,212 B2
(45) Date of Patent: Oct. 3, 2017

(54) FIN WIDTH MEASUREMENT USING QUANTUM WELL STRUCTURE

(71) Applicant: GLOBALFOUNDRIES Inc, Grand Cayman (KY)

(72) Inventor: Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 708 days.

(21) Appl. No.: 14/030,458

(22) Filed: Sep. 18, 2013

(65) Prior Publication Data

US 2015/0077086 A1    Mar. 19, 2015

(51) Int. Cl.
*H01L 29/78*   (2006.01)
*H01L 21/66*   (2006.01)
*H01L 29/66*   (2006.01)

(52) U.S. Cl.
CPC ............ *H01L 29/785* (2013.01); *H01L 22/14* (2013.01); *H01L 29/66795* (2013.01)

(58) Field of Classification Search
CPC ............ H01L 29/78; H01L 29/66; G01B 7/02
See application file for complete search history.

(56) References Cited

U.S. PATENT DOCUMENTS

| | | | | |
|---|---|---|---|---|
| 5,182,452 A | * | 1/1993 | Niwa | B82Y 35/00 250/306 |
| 6,031,245 A | * | 2/2000 | Patel | B82Y 10/00 257/14 |
| 7,002,175 B1 | | 2/2006 | Singh et al. | |
| 7,462,538 B2 | * | 12/2008 | Li | H01L 21/82382 257/274 |
| 2003/0048819 A1 | * | 3/2003 | Nagano | G02B 6/4206 372/36 |
| 2005/0056827 A1 | | 3/2005 | Li et al. | |
| 2005/0224880 A1 | * | 10/2005 | Lee | H01L 29/42392 257/347 |

(Continued)

OTHER PUBLICATIONS

Cressler, John D., "Silicon Heterostructure Devices," 23.2—Principle of Resonant Tunneling, CRC Press, FL, 2008, pp. 23-2-23-4.

*Primary Examiner* — Giovanni Astacio-Oquendo
*Assistant Examiner* — Alvaro Fortich
(74) *Attorney, Agent, or Firm* — Wayne F. Reinke, Esq.; Heslin Rothenberg Farley & Mesiti P.C.

(57) ABSTRACT

A method for accurately electrically measuring a width of a fin of a FinFET, using a semiconductor fin quantum well structure is provided. The semiconductor fin quantum well structure includes a semiconductor substrate and at least one semiconductor fin coupled to the substrate. Each of the semiconductor fin is sandwiched by an electrical isolation layer from a top and a first side and a second side across from the first side, to create a semiconductor fin quantum well. At least one gate material is provided on each side of the electrical isolation layer. A dielectric layer is provided over the top of the electrical isolation layer to further increase the electrical isolation between the gate materials. The width of the semiconductor fin is measured accurately by applying a resonant bias voltage across the fin by applying voltage on the gate materials from either side. The peak tunneling current generated by the applied resonant bias voltage is used to measure width of the fin.

20 Claims, 2 Drawing Sheets

(56) References Cited

U.S. PATENT DOCUMENTS

| | | | | |
|---|---|---|---|---|
| 2005/0269629 A1* | 12/2005 | Lee | H01L 21/845 | 257/327 |
| 2007/0075351 A1* | 4/2007 | Schulz | H01L 21/82382 | 257/314 |
| 2007/0183185 A1* | 8/2007 | Guo | G11C 11/412 | 365/156 |
| 2008/0121983 A1* | 5/2008 | Seong | H01L 21/28282 | 257/324 |
| 2009/0127592 A1* | 5/2009 | El-Kareh | H01L 21/8232 | 257/262 |
| 2009/0212369 A1* | 8/2009 | Park | H01L 21/82384 | 257/368 |
| 2009/0283838 A1* | 11/2009 | Park | H01L 21/82384 | 257/369 |
| 2010/0244144 A1* | 9/2010 | Hsueh | H01L 23/5256 | 257/379 |
| 2010/0252816 A1* | 10/2010 | Ko | H01L 29/66818 | 257/24 |
| 2011/0101456 A1* | 5/2011 | Hoentschel | H01L 29/045 | 257/347 |
| 2012/0168877 A1* | 7/2012 | Mukherjee | H01L 29/66446 | 257/401 |
| 2013/0173214 A1* | 7/2013 | Yamashita | G01B 7/023 | 702/170 |

* cited by examiner

FIN WIDTH MEASUREMENT USING QUANTUM WELL STRUCTURE

BACKGROUND OF THE INVENTION

Technical Field

The present invention generally relates to semiconductor devices, and more particularly, to measuring the width of a fin in a FinFET technology using a quantum well structure based on a measured peak tunneling current though the fin.

Background Information

In contrast to traditional planar metal-oxide-semiconductor, field-effect transistors (MOSFETs), which are fabricated using conventional lithographic fabrication methods, non-planar FET's incorporate various vertical transistor structures. One such semiconductor structure is the "FinFET", which takes its name from the multiple semiconductor "fins" that are used to form the respective gate channels, and which are typically up to ten of nanometers in width. Advantageously, the fin structure helps to control current leakage through the transistor in the off stage, and a double gate or tri-gate structure may be employed to control short channel effects.

However, a variation in thickness of the semiconductor "fins" can affect the overall process stability and manufacturability, which in turn, can affect the semiconductor device performance and overall performance of the integrated circuit (IC). Currently, variation in thickness of the semiconductor "fins" is measured using an extensive fin measurement value data collection performed across the footprint of the semiconductor wafer or chip. However, due to vertical transistor structures of the semiconductor "fins", such an application of data collection becomes limited, even more so as the semiconductor device fabrication processing transitions to smaller dimensions. Various other commonly employed optical measurement techniques such as, for example, transmission electron microscope, can be cost prohibitive and destructive.

Hence, there continues to be a need for a reliable, cost-effective method to measure the lateral thickness (also referred to as "width") of semiconductor "fins".

SUMMARY OF THE INVENTION

The shortcomings of the prior art are overcome and additional advantages are provided through the provision, in one aspect, of a method of measuring the width of a fin of a FinFET semiconductor device using a quantum well structure, based on a measured peak tunneling current through the fin. The method includes providing a semiconductor fin quantum well structure. The structure includes a semiconductor fin, an electrical isolation layer covering the fin at a top, a first side and a second side opposite the first side, a dielectric layer above the top isolation layer, a first layer of gate material adjacent the first side isolation layer and a second layer of gate material adjacent the second side isolation layer. Each of the first and second layers of gate material include a metal-based compound or alloy from Groups III-V of the Periodic Table of Elements. The method further includes applying a resonant voltage bias across the fin by applying a first voltage to the first layer of gate material and a second voltage to the second layer of gate material, and measuring a peak tunneling current through the isolation layer on the first side, across a width of the fin and through the isolation layer on the second side, and determining the width of the fin based on the measured peak tunneling current.

In accordance with another aspect, a semiconductor structure for measuring a width of a fin of a FinFET includes a semiconductor fin, an electrical isolation layer covering the fin at a top, a first side and a second side opposite the first side. The semiconductor structure further includes a dielectric layer above the top isolation layer, a first layer of gate material adjacent the first side isolation layer and a second layer of gate material adjacent the second side isolation layer, a width of the fin determinable under a resonant voltage bias across the fin, from a peak tunneling current through the isolation layers and the fin therebetween. Each of the first and second layers of gate material include a metal-based compound or alloy from Groups III-V of the Periodic Table of Elements.

In accordance with yet another aspect, apparatus for measuring a width of a fin of a FinFET includes a semiconductor fin, an electrical isolation layer covering the fin at a top, a first side and a second side opposite the first side. The apparatus further includes a dielectric layer above the top isolation layer, a first layer of gate material adjacent the first side isolation layer and a second layer of gate material adjacent the second side isolation layer. Each of the first and second layers of gate material include a metal-based compound or alloy from Groups III-V of the Periodic Table of Elements. The apparatus further includes a testing device for applying a resonant voltage bias across the fin by applying a first voltage to the first layer of gate material and a second voltage to the second layer of gate material and a current testing instrument for measuring a peak tunneling current through the isolation layer on the first side, across a width of the fin and through the isolation layer on the second side, wherein the width of the fin is determined based on the measured peak tunneling current.

These, and other objects, features and advantages of this invention will become apparent from the following detailed description of the various aspects of the invention taken in conjunction with the accompanying drawings.

DETAILED DESCRIPTION OF THE INVENTION

Figure 1:
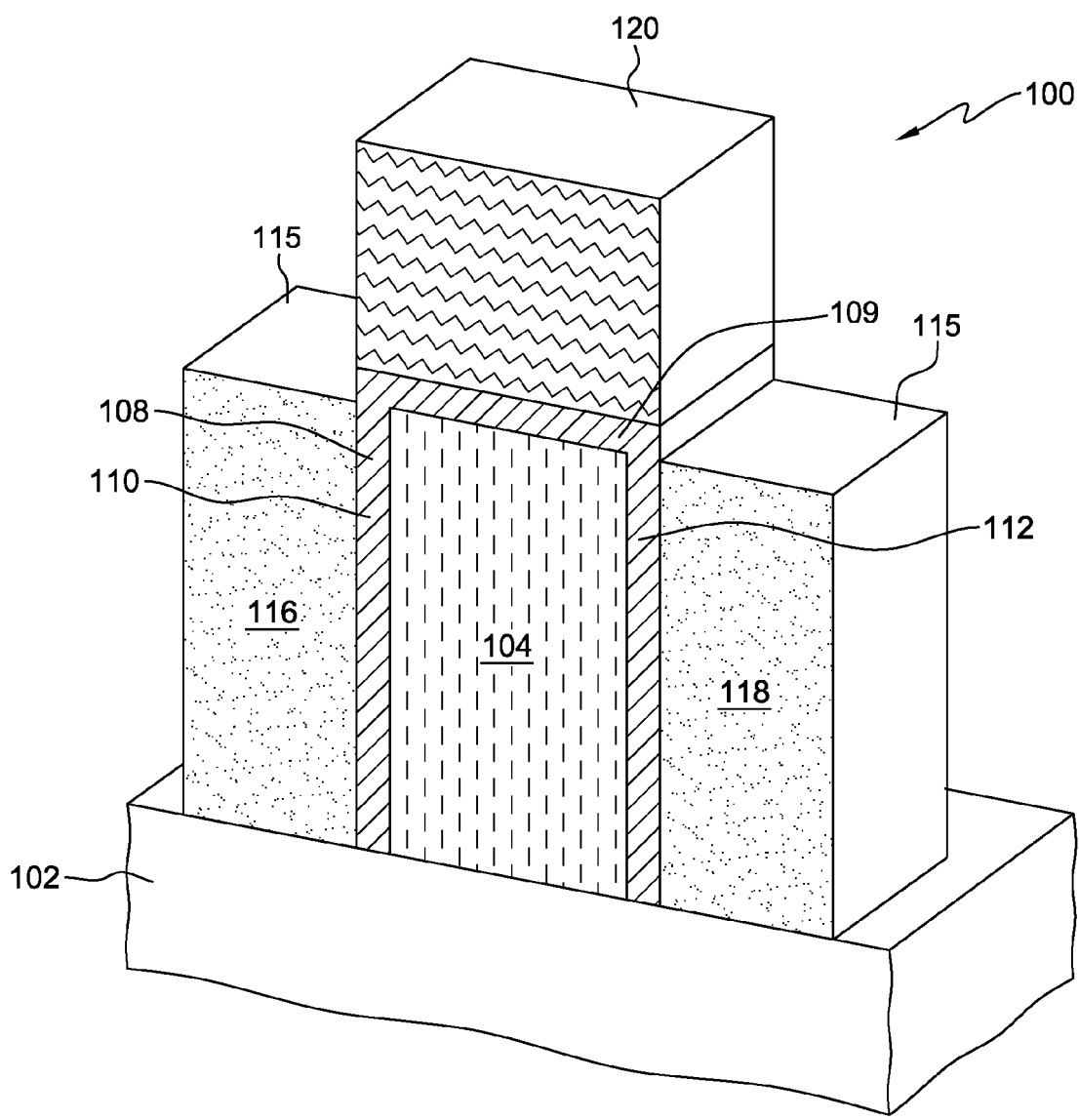
FIG. 1 is a perspective view of one example of a semiconductor fin quantum well structure, including a semiconductor fin surrounded on top and two opposite sides by an electrical isolation layer and at least one gate material immediately adjacent the two side isolation layers, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 schematically illustrates a perspective view of one example of a simplified semiconductor fin quantum well structure 100, in accordance with one or more aspects of the present invention, including a fin 104 that is coupled to a semiconductor substrate 102. As described herein, a semiconductor fin quantum well structure represents a structure in which a semiconductor fin may be surrounded on top and two opposite sides by a thin electrical isolation layer. The thin electrical isolation layers create an energy barrier, which may have a relatively larger band gap as compared to the semiconductor fin material, and creates a quantum well such that the energy carriers, for example, n-type carriers (also referred to as electrons) and p-type carriers (also referred to as holes), are more likely to be confined within the semiconductor fin having a smaller energy band gap.

Returning to FIG. 1, the semiconductor substrate 102 may include, for example, bulk semiconductor material such as, for example, silicon, in the form of a bulk silicon wafer. In one example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement insulator (SRI) substrates and the like. Substrate 102 may in addition or instead include various isolations, dopings and/or device features. The substrate may include other suitable elementary semiconductors or compounds from Groups III, IV and V of the periodic table, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof. Further examples include an alloy semiconductor, for example, GaAsP, AlInAs, GaInAs, GaInP, or GaInAsP or combinations thereof.

Continuing further with FIG. 1, the semiconductor fin 104 may be made of any suitable material. In the present example, semiconductor fin 104 may include silicon. In another example, other semiconductor materials that may be formed into a fin for a quantum well structure may include, but are not limited to, germanium and silicon germanium. Although not critical to the invention, each semiconductor fin may include an area at a top thereof for a source, drain and channel. It will be understood that the positioning of the source and drain areas could be switched. In one example, the width of semiconductor fin 104 may be in the range of about 2 nanometers to about 15 nanometers, and more particularly, include a width of at least about 10 nanometers.

Referring further to FIG. 1, semiconductor fin 104 may be surrounded by an electrical isolation layer 108, for example, top 109, a first side 110 and a second side 112, second side 112 being opposite from first side 110. By way of example, electrical isolation layer 108 may include dielectric materials with "band offset" values lower as compared to that of semiconductor fin material. As used herein, "band offset" is a measure of misalignment between energy levels at the interface of two materials such as, for example, the top isolation layer and the semiconductor fin material. In a specific example, electrical isolation layer 108 may include, but is not limited to, silicon dioxide, silicon nitride, high-k dielectric materials (where k=3.9 for $SiO_2$) such as, for example, aluminum oxide ($Al_2O_3$), yttrium oxide ($Y_2O_3$), tantalum oxide ($Ta_2O_3$), titanium oxide ($TiO_2$), hafnium oxide($HfO_2$), praseodymium oxide ($Pr_2O_3$), zirconium oxide ($ZrO_2$) and their alloys and laminates. The thickness of electrical isolation layer 108 may be in the range of about 0.5 nanometers to about 3 nanometers.

Gate materials 115 are provided immediately adjacent sides 110 and 112, as shown further in FIG. 1. Note that first layer of gate material 116 is disposed immediately adjacent to the first side 110 of isolation layer 108, and second layer of gate material 118 is disposed immediately adjacent to second side 112 of isolation layer 108. The material of gate materials 115 may include compounds from Groups III, IV and V of the periodic table, such as, for example, gallium arsenide (GaAs), gallium phosphide (GaP), indium phosphide (InP), indium arsenide (InAs), and/or indium antimonide (InSb) or combinations thereof. Further examples include an alloy semiconductor, for example, GaAsP, AlInAs, GaInAs, GaInP, or GaInAsP or combinations thereof. Note that first layer of gate material 116 may be fabricated with a material that is the same or substantially similar to the material of second layer of gate material 118 but, for example, may also be substantially different from the material of the second layer of gate material.

Continuing still further with FIG. 1, a dielectric layer 120 is provided over the top 109 of electrical isolation layer 108. Note that dielectric layer 120 advantageously facilitates in further enhancing the electrical isolation between gate materials 115. Dielectric layer 120 may be deposited using conventional deposition processes such as, for example, chemical vapor deposition (CVD), low-pressure CVD (LP-CVD), or plasma-enhanced CVD (PE-CVD). Note that the dielectric layer, having a conventional thickness, may include or be fabricated of a material such as, for example, silicon nitride. In one example, silicon nitride may be deposited using a halogen-free precursor such as, for example, bis(t-butylamino)silane (BTBAS) ($SiC_8N_2H_{22}$) and ammonia ($NH_3$) at about 550° C.

Figure 2:
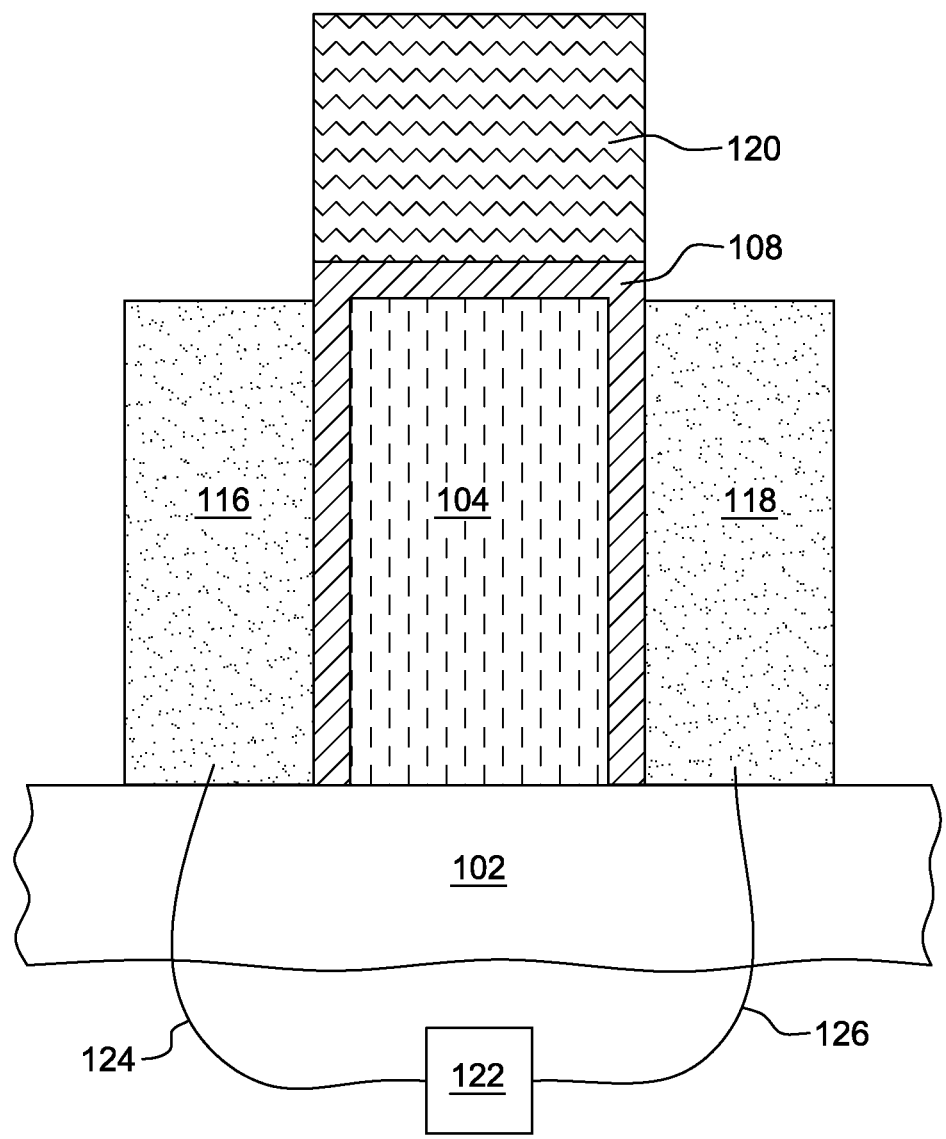
FIG. 2 is a simplified block diagram of one example of using a testing device to supply a resonant bias voltage, in accordance with one or more aspects of the present invention.

As will be subsequently discussed with respect to FIG. 2, lateral width of a semiconductor fin may be accurately measured electrically using semiconductor fin quantum well structure 100, by applying a resonant bias voltage across the semiconductor fin and measuring a tunneling current through the fin. As discussed above, the semiconductor fin has been surrounded by an electrical isolation layer 108 from top 109 as well as each side, for example, a first side 110 and a second side 112, second side 112 being opposite from first side 110. A resonant bias voltage may be applied on the semiconductor fin quantum well, for example, by applying a first voltage to the first layer of gate material 116 and a second voltage to the second layer of gate material 118. As shown in FIG. 2, a testing device 122 or other means to supply a bias voltage is connected to gate material 116 and gate material 118 via wires 124 and 126, respectively, or other means of electrical connection. In one example, a bias voltage of about 2V can be applied by, for example, supplying a voltage of about 1V to gate material 116 over wire 124 and a voltage of 1V to gate material 118 over wire 126.

Note that as the fin width decreases, in one example, to less than about 10 nanometers, it approaches the de Broglie wave length of the electrons. A quantization of charge carriers, such as, for example, electrons and holes, begins to happen inside the semiconductor fin quantum well structure. As described herein, quantization of charge carriers generally refers to the probability of finding the charges, for example, electrons or holes, and is substantially greater than compared to the probability of finding the charges in a conventional conduction band edge. This quantization of charge carriers advantageously facilitates in creating "quasi' confined energy states, depending on the lateral thickness (also referred to as width) of the semiconductor fin, resulting in substantial alignment in Fermi energy of the gate material with that of the semiconductor fin quantum well, thereby enhancing tunneling of conduction electrons from the first layer of gate material 116 into the semiconductor fin quantum well and the semiconductor fin quantum well to the second layer of gate material 118. A quasi state can be described as a temporary channel formed for carrier movement with an appropriate bias voltage application. Note that when at resonance, an incident wave build up may occur in semiconductor fin 104, due to a constructive interference caused between the incoming wave from first layer of gate material 116 and reflected wave from second layer of gate material 118. When an appropriate bias voltage is applied across the fin at the first layer of gate material 116 and second layer of gate material 118, the quantum energy level of the semiconductor fin may be aligned with the emitter side, resulting in a resonant current tunneling through the electrical isolation layer, depending on the width of the semiconductor fin. Note that the tunneling current depends upon the material property of the electrical isolation layer and the quantum well, more particularly, the lateral thickness or the width of the semiconductor fin. Further, as the resonant bias voltage is increased, and depending on the width of the semiconductor fin, the resonant current alters, resulting in the decay rate of the isolation layer 108 on the first side 110 and the second side 112. With the increase of voltage, a misalignment of the conduction band of electrode 116 or 118 with the fin channels begins to happen, resulting a decrease in the tunneling current. A further increase in voltage further decreases the tunneling current. The tunneling current decay is proportional to the applied voltage beyond the resonant point for specific design parameters. This tunneling current can be measured, for example, with a low current testing method and instrument. The signal-to-noise ratio of this tunneling current can be increased by measuring at a lower temperature, for example, at about −40° C.

The determination of fin width from the peak tunneling current can be done at least three different ways. For example, a first way to determine fin width is by indexing into a preexisting table of peak tunneling current correlated to fin width. Such a table can be produced, in one example, by employing a tunneling electron microscope. However, the data for such a table would only need to be produced once for a given technology node (e.g., 7, 10, 14, and 20 nm). A second way to determine fin width is by a calculation combining a decay rate (e.g., in units of nA/µs (nano Ampere per micro second)) of each of the isolation layers on the first side and the second side. Finally, fin width may be determined from peak tunneling current based on a preexisting mathematical model correlating peak tunneling current to fin width. Such a model could, for example, be based on the data used to create the indexing table noted able.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:
1. A method, comprising:
providing a semiconductor fin quantum well structure, the structure comprising:
a semiconductor fin;
an electrical isolation layer covering the fin at a top, a first side and a second side opposite the first side;
a dielectric layer above the top isolation layer;
a first layer of gate material adjacent the first side isolation layer wherein the first layer of gate material comprises a metal-based compound or alloy from Groups III-V of the Periodic Table of Elements; and
a second layer of gate material adjacent the second side isolation layer, wherein the second layer of gate material comprises a metal-bases compound or alloy from Groups III-V of the Periodic Table of Elements;
applying a resonant voltage bias across the fin by applying a first voltage to the first layer of gate material and a second voltage to the second layer of gate material;
measuring a peak tunneling current through the isolation layer on the first side, across a width of the fin and through the isolation layer on the second side; and
determining the width of the fin based on the measured peak tunneling current.

2. The method of claim 1, wherein determining a width of the fin comprises indexing into a preexisting table of peak tunneling current correlated to fin width.

3. The method of claim 2, wherein the table is produced using a tunneling electron microscope.

4. The method of claim 1, wherein the determining comprises combining a decay rate of the isolation layers on the first side and the second side.

5. The method of claim 1, wherein determining the width comprises determining the width based on a preexisting mathematical model correlating tunneling current and fin width.

6. The method of claim 1, wherein the applying and measuring are performed at a subzero temperature.

7. A semiconductor structure, comprising:
a semiconductor fin;
an electrical isolation layer covering the fin at a top, a first side and a second side opposite the first side;
a dielectric layer above the top isolation layer;
a first layer of gate material adjacent the first side isolation layer, wherein the first layer of gate material comprises a metal-based compound or alloy from Groups III-V of the Periodic Table of Elements; and
a second layer of gate material adjacent the second side isolation layer, wherein the second layer of gate material comprises a metal-based compound or alloy from Groups III-V of the Periodic Table of Elements;
wherein a width of the fin can be determined under a resonant voltage bias across the fin, from a peak tunneling current through the isolation layers and the fin therebetween.

8. The semiconductor structure of claim 7, wherein the fin comprises one of silicon, germanium and silicon germanium.

9. The semiconductor structure of claim 7, wherein the electrical isolation layer comprises a dielectric material.

10. The semiconductor structure of claim 9, wherein the dielectric material comprises at least one of silicon dioxide, silicon nitride and a high-k dielectric.

11. The semiconductor structure of claim 7, wherein the gate material comprises one or more elements from periodic table columns III, IV and V.

12. The semiconductor structure of claim 7, wherein the fin has a width of at least about 10 nm.

13. The semiconductor structure of claim 7, wherein the gate material of the first layer is different from the gate material of the second layer.

14. An apparatus, comprising:
a semiconductor fin;
an electrical isolation layer covering the fin at a top, a first side and a second side opposite the first side;
a dielectric layer above the top isolation layer;
a first layer of gate material adjacent the first side isolation layer, wherein the first layer of gate material comprises a metal-based compound or alloy from Groups III-V of the Periodic Table of Elements;
a second layer of gate material adjacent the second side isolation layer, wherein the second layer of gate material comprises a metal-based compound or alloy from Groups III-V of the Periodic Table of Elements;
a testing device for applying a resonant voltage bias across the fin by applying a first voltage via a first wire to the first layer of gate material and a second voltage via a second wire to the second layer of gate material; and
a current testing instrument for measuring a peak tunneling current through the isolation layer on the first side, across a width of the fin and through the isolation layer on the second side;
wherein the width of the fin is determined based on the measured peak tunneling current.

15. The apparatus of claim 14, wherein the semiconductor fin comprises one of silicon, germanium and silicon germanium.

16. The apparatus of claim 14, wherein the electrical isolation layer comprises a dielectric material.

17. The apparatus of claim 16, wherein the dielectric material comprises at least one of silicon dioxide, silicon nitride and a high-k dielectric.

18. The apparatus of claim 14, wherein the gate material comprises one or more elements from periodic table columns III, IV and V.

19. The apparatus of claim 14, wherein the fin has a width of at least about 10 nm.

20. The apparatus of claim 14, wherein the gate material of the first layer is different from the gate material of the second layer.

* * * * *